United States Patent [19]

Du Bois et al.

[11] 4,343,388

[45] Aug. 10, 1982

[54] APPARATUS FOR SORTING ARTICLES

[75] Inventors: Loring E. Du Bois, Kansas City; Lawrence D. Simpson, Summit, both of Mo.

[73] Assignee: Western Electric Co., Inc., New York, N.Y.

[21] Appl. No.: 179,592

[22] Filed: Aug. 21, 1980

Related U.S. Application Data

[62] Division of Ser. No. 24,223, Mar. 26, 1979, Pat. No. 4,235,014, which is a division of Ser. No. 863,107, Dec. 22, 1977, Pat. No. 4,170,021.

[51] Int. Cl.³ ............................................. B65G 47/24
[52] U.S. Cl. ................................. 193/47; 221/157; 221/171; 221/172
[58] Field of Search .................. 193/31 R, 39, 44, 46, 193/47; 198/398, 399, 400, 442; 221/157, 171, 172; 209/656

[56] References Cited

U.S. PATENT DOCUMENTS

| | | | |
|---|---|---|---|
| 1,022,818 | 4/1912 | Bogdanffy | 193/46 X |
| 1,053,634 | 2/1913 | Nagy | 193/46 X |
| 2,892,530 | 6/1959 | Fox, Jr. | |
| 3,341,928 | 9/1967 | Naumann | |
| 3,355,002 | 11/1967 | Greck | 198/442 |
| 3,650,369 | 3/1972 | Vergobbi | 198/400 X |

*Primary Examiner*—Jeffrey V. Nase
*Attorney, Agent, or Firm*—W. O. Schellin

[57] ABSTRACT

Diode chips (44) are cut from a p-n sheet-diffused semiconductor wafer (41). Instead of having conventional rectangular shapes, the chips have a rhomboidal shape. This makes the shape of the chips asymmetric in that one surface (46) of each chip becomes a distinguishable mirror image of its other surface (47). The direction of the p-n junction in the wafer is oriented with respect to the shape of the chips to be cut to place the same conductivity type region adjacent to the same rhomboidal shape of the surface. The shape of the chips (44) thereby aids apparatus (59) to sort the chips into two groups, each group consisting of chips of the same polarity or orientation of their p-n junctions with respect to a common support plane. The apparatus (59) includes a feed track (60) leading to a fork (61) in the track. A center obstruction (62) engages the leading edge of the chips (44) and deflects the chips into one or the other of two branch tracks (63) or (64), depending on the slope of the leading edge of the chips.

1 Claim, 5 Drawing Figures

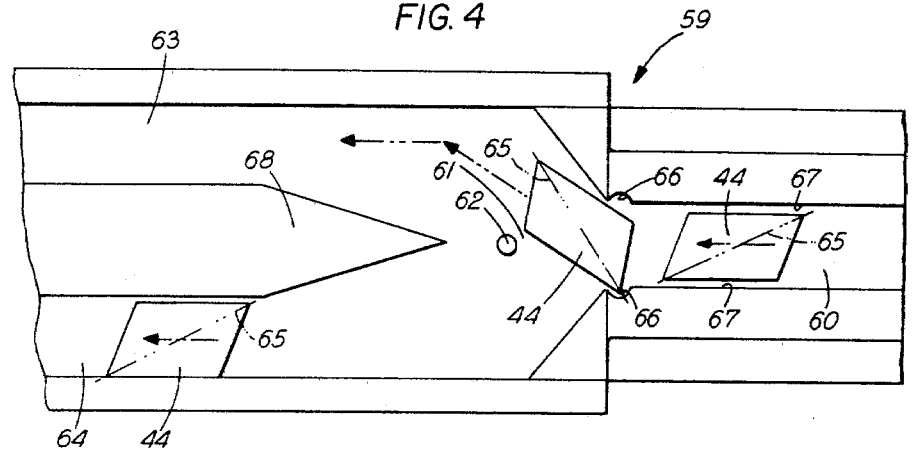
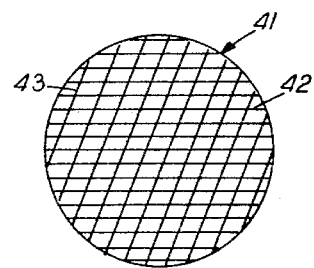
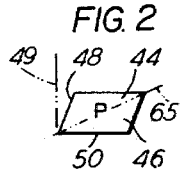
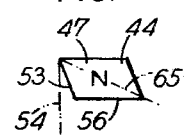
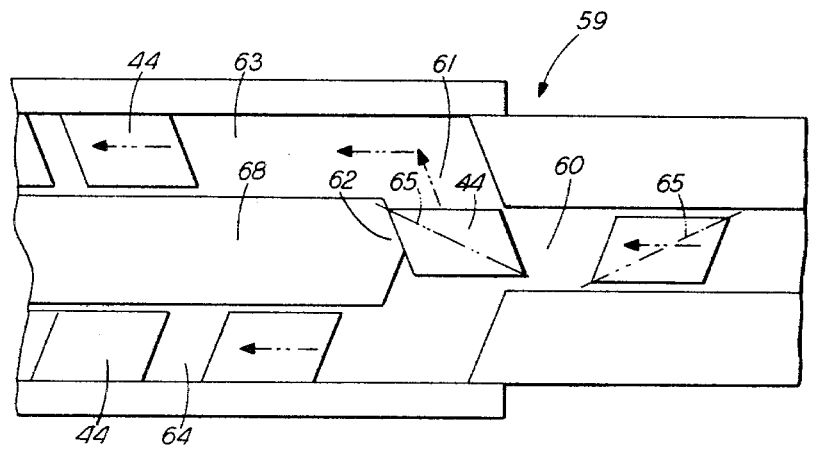

APPARATUS FOR SORTING ARTICLES

This is a division of Ser. No. 24,223 filed Mar. 26, 1979, now U.S. Pat. No. 4,235,014, which is a division of Ser. No. 863,107 filed Dec. 22, 1977, now U.S. Pat. No. 4,170,021.

BACKGROUND OF THE INVENTION

1. Field of the Invention

This invention relates generally to handling articles having intrinsic polar characteristics. More particularly, the invention relates to identifying the orientation of such characteristics within the articles and to sorting the articles into groups of the same orientation of the characteristics within the articles. The invention is of particular interest to the assembly of semiconductor chips, such as diodes. For instance, in the manufacture of varistors, it becomes necessary to group the diodes according to the orientation of their p-n junctions prior to the attachment of leads to the diodes.

The present invention is discussed with respect to sheet-diffused diode chips. However, it should be understood that any reference in the disclosure to this product is for illustrative purposes only, and that such reference is not intended to limit the scope of the invention.

2. Discussion of the Prior Art

Conventionally, semiconductor devices are formed in great numbers as individual units in a single wafer. The wafer is subjected to a series of processing steps. The number and the sequence of these steps vary, depending upon the complexity of the final product. Upon completion of the steps, the wafer is divided into the individual units. These units are commonly referred to as dice or chips.

Depending on the previous manufacturing steps, the chips may be complex integrated circuits or they may be simple diodes. One method of manufacturing diodes is to generate within the body of the wafer a single rectifying p-n junction parallel to the two major surfaces of the wafer. The junction separates two doped semiconductor regions or domains, each of opposite conductivity type with respect to the other. Each domain lies adjacent to and in contact with one of the major surfaces. The domains are formed by well known methods. For instance, impurities of one conductivity type, such as phosphorous are diffused from one surface into the semiconductor wafer which is comprised of single-crystal silicon material, predoped with impurities of the opposite conductivity type, such as boron.

The wafer then becomes a single, large diode. When both major surfaces of the wafer are metallized, they become the two terminals of the diode. Subsequent to the metallization in one of various conventional ways, the diode wafer is separated into a number of small diode chips. Each of these chips has diode characteristics since each chip includes its respective portion of the previously formed p-n junction between its two major surfaces. Diodes formed by the described process of uniformly diffusing impurities through the wafer to form a single large diode and then dividing the wafer into small diode chips are referred to as sheet-diffused diodes.

Handling the individual chips efficiently in further manufacturing operations becomes a concern because of the small size of the chips and their intrinsic polar characteristics. These further manufacturing operations include the attaching of leads to the metallized terminal areas on the two major surfaces of the chips and the encapsulation of the chips to protect them from environmental influences that could destroy or adversely affect their electrical characteristics. For some products, it may be desirable to know the orientation of the p-n junction within each of the diode chips before the diodes become encapsulated.

When, however, sheet-diffused diodes are separated from the wafer by either scribing and breaking or by sawing, their edges are substantially perpendicular between the two major surfaces. When both major surfaces of the diodes are coated with the same type of contact metal, the polarity of the diodes, meaning the orientation of the p-n junctions within the diode chips, is not readily ascertainable. In some prior art processes in which the orientation of the diodes has to be known to permit the diodes to be correctly assembled, electrical testing is used to determine the orientation of the diodes.

For instance, in a process for making a varistor, two diodes are assembled in parallel between two leads. However, for the varistor to have its desired characteristics, the polarities of the diodes are reversed with respect to each other. The assembly of the diodes presupposes knowledge about the orientation of the diodes.

In the past, these diodes have been assembled by a multi-station and multi-function apparatus. The apparatus receives the diode chips from a conventional vibratory feeder bowl. The chips vibrate in a single file along a track to a test point. At that point a probe is lowered toward the track. The probe contacts the chip located at the test point and performs a test to its polarity of its p-n junction. Depending on the outcome of this test, the chip is transferred either to one or another track. Since this test is performed on all chips in sequence, they become sorted into two groups depending on the orientation of the p-n junction in each of the chips.

The operation of such an assembly apparatus is, of course, complex. The apparatus executes many mechanical functions and requires many linkages. A malfunction in any of the linkages requires a total shutdown of the assembly operation. Consequently, the average hourly output of the apparatus is often decreased by downtimes. It is, therefore, desirable to simplify the operation of sorting the diode chips.

SUMMARY OF THE INVENTION

The present invention contemplates an apparatus for sorting articles in the shape of rhomboidal parallelepipeds. The apparatus includes a feed track for advancing the articles in a single row along a path. Two branch tracks are joined at a forked end to the feed track. An obstruction is located at the fork in the center of the path of the articles. The obstruction deflects the articles into one of the branch tracks, selected by the direction of the slope of the leading edge of the article with respect to the direction of travel of the respective article along the track.

BRIEF DESCRIPTION OF THE DRAWING

The following detailed description will be better understood when it is read in conjunction with the appended drawing wherein:

FIG. 1 is a semiconductor wafer which has been scribed in accordance with the present invention;

FIGS. 2 and 3 show chips separated from the wafer of FIG. 1;

FIG. 4 shows a simplified top view of an apparatus for mechanically separating articles such as the chips of FIGS. 2 and 3 into one of two groups depending on their orientation; and FIG. 5 shows a top view of an alternate embodiment of the apparatus of FIG. 4.

DETAILED DESCRIPTION

The present invention is particularly applicable to handling chips used in a symmetrical diode varistor. Such a varistor is described in greater detail in the original application hereof, Ser. No. 863,107 filed Dec. 22, 1977, now U.S. Pat. No. 4,170,021. For a complete understanding of the subject matter surrounding the present invention, the entire disclosure of U.S. Pat. No. 4,170,021 is incorporated herein by reference.

Chips in Accordance with the Invention

Referring now to FIG. 1, a wafer 41 shows a plurality of parallel horizontal separation lines 42. Separation lines 43, however, are formed at an angle other than a right angle to the horizontal separation lines 42. Also, the spacing between the separation lines 43 is distinctly altered from the spacing of the separation lines 42.

Each chip 44 separated from the wafer 41 by the cuts spaced and oriented in this manner becomes a parallelepiped. A parallelepiped is defined as a prism with rhomboidal bases. Chips 44 cut from the wafer 41 in this manner have two distinctly identifiable surfaces 46 and 47 for their bases. These surfaces 46 and 47 are shown in FIGS. 2 and 3 respectively.

In FIG. 2, the chip 44 is shown with the major surface 46 facing up. The major surface 46 lies adjacent the p-type semiconductor material as a first pole of the chip and is identified by a shorter edge 48 being rotated clockwise from a vertical line 49 drawn with respect to a longer edge 50.

In FIG. 3, the surface 47 adjacent the n-type material, for example, the second pole, of the semiconductor chip 44 is distinguished from the surface 46 by having a shorter edge 53 rotated counterclockwise from a vertical line 54 drawn with respect to the chip's longer edge 56. By consistently orienting the direction of the p-n junction in each wafer 41 with respect to the direction in which the separation lines 42 and 43 are cut, the orientation of the p-n junctions within each chip 44 becomes known. The direction in which the p-n junctions in the chips 44 face become visually identifiable by the shape of the exposed major surface of the chip.

In the preferred embodiment of the invention, the major surfaces 46 and 47 of the chip 44 are oblique parallelograms having nonequal adjacent sides. This geometric shape is also called a rhomboid. The shape is characterized in that it is nonsymmetric about any axis which can be drawn in its plane. Consequently, there is no axis about which the shape of any of the major surfaces can be folded over on itself so that the two folded halves of the shape coincide. This characteristic of having no axis of symmetry is a general requirement for a flat object like the chip 44 to have one surface a distinguishable mirror image of the other. Shapes other than the rhomboidal surfaces 46 and 47 of the chips 44 can have this characteristic. However, the rhomboidal shape is easily obtained by the two sets of separation lines 42 and 43.

The chips 44 described herein are preferably cut from the wafer 41 having a thickness of substantially 0.007 inch. The chips 44 are preferably about 0.035 inch wide with a long edge 50, 56 being about 0.058 inch long. The angle between the two sets of separation cuts has been chosen to be about 68°. These dimensions are, of course, examples of one embodiment only and are not to be understood as being limiting to the scope of the invention.

Sorting the Chips

The rhomboidal shapes of the surfaces 46 and 47 have advantages other than merely to permit an observer to visually determine the orientation of the p-n junction in the chip 44. It is further possible to use the rhomboidal geometry of the chips 44 to sort the chips 44 into two groups of like orientation of the p-n junctions without individual electrical testing.

FIGS. 4 and 5 show two representative embodiments of a mechanical sorting track which are designated generally by the numeral 59. The purpose of the track is to separate the chips 44 into the two groups as the chips advance along the track. A preferred way to advance the chips 44 in a single row along a feeder track 60 is to vibrate the track 60 at an angle upward in the direction in which the chips are to be advanced. Other ways of advancing the chips 44 are, of course, acceptable. For instance, the chips can be moved by slanting the track 60 sufficiently to permit gravity to cause the chips to slide along the track. Also, a combination of slanting the track 60 and vibrating it may be used to move the chips, or to move other articles along a similar track.

An alternate mechanism for causing articles such as the chips 44, or even other articles, to move along the track 60 is to employ a cushion of air between the articles and the surface of the track. To generate an air cushion between the articles and the base of the track, air is usually supplied through apertures (not shown) which are located in the base. The apertures are usually slanted with respect to the base of the track 60 to direct the air in the direction in which it is desired to move the articles. Air escaping through the apertures generates the cushion and pushes the articles in the desired direction.

In FIGS. 4 and 5, the chips 44 advance along the single feeder track 60 to a branch or fork 61. At the fork 61, a center obstruction 62 in the track 60 causes the chips 44 to be deflected into one or another of two parallel branch tracks 63 and 64. Whether the chips 44 are deflected to the right into the branch track 63 or the the left into the track 64 depends on the direction in which the major axis 65 of each chip 44 deviates from the direction in which the chip travels.

Referring to FIG. 2, when the p-type material of the chip 44 faces up the major axis 65 deviates to the left with respect to the long edge 50 of the chip. On the other hand, when the n-type material faces up, as shown in FIG. 3, the major axis 65 deviates toward the right from the direction in which the long edge 56 extends.

The relationship between the orientations of the p-n junction in each chip 44 and its topographical shape allows the chips 44 to be sorted mechanically into two groups, one group having their p-n junctions in each chip oriented in the opposite direction from those in the other group.

In FIG. 4, the chip 44 shown at the fork 61 corresponds in the orientation of its p-n junction to the chip 44 shown in FIG. 3. The major axis 65 deviates to the right from its direction of travel in the track 60. The chip is being deflected into the right branch track 63. Of the chips 44 preceding and following the chip at the fork 61, the p-type material faces up and the major axes deviate to the left from their direction of travel. Those chips 44 with their major axes 65 deviating toward the left are deflected toward the left by the obstruction 62.

The embodiment of the sorting track 59 shown in FIG. 4 depicts a rotation of the chips 44 as they are deflected into the branch tracks 63 and 64. The rotation of the chips 44 requires recesses 66 for clearances in both walls 67 near the end of the track 60. The recesses 66 receive the trailing corner of the chips 44 to permit the chips 44 to rotate or pivot toward one or the other side when the lead surfaces of the chips engage the obstruction 62. It is not necessary that the center obstruction 62 is a pin as shown in FIG. 4. It can also be the leading edge of a dividing barrier 68 between the two tracks 63 and 64.

The width of the two tracks 63 and 64 is initially wider than the width of the track 60, again to facilitate the rotation of the chips until they reach the straight portions of the tracks 63 and 64. From there, the chips 44 advance to a pickup station (not shown).

As the chips 44 are continuously replenished at the front end of the feeder track 60, the chips 44 become divided at the fork 61 into groups of chips having like orientation. Each track (63 and 64) tends to fill up with chips 44 having p-n junctions oriented in the same direction.

At the pickup station, the chips 44 are loaded, preferably two at a time, into an assembly fixture by an apparatus similar to that shown in U.S. Pat. No. 3,341,928 to H. K. Naumann disclosing apparatus for testing, sorting and assembling articles. The tracks 63 and 64 are consequently preferably spaced at a distance which is the same as the spacing would be between two chips 44 in an assembly fixture or in a finally assembled device. The spacing of the tracks 63 and 64 is accomplished by choosing the correct width for the dividing barrier 68.

Referring to FIG. 5, there is shown a second, alternate embodiment of the sorting track 59 of FIG. 4. The track 59 of FIG. 5 is distinguished from that in FIG. 4 by causing the chips 44 to undergo a translational displacement to become separated into groups at the fork 61. The chips 44 are initially advanced along the feeder track 60. However, at the fork 61, the chips 44 are not rotated to be directed into their respective branches 63. Instead, a transverse movement in either one or the other lateral direction is superimposed on the general forward movement of the chip. This transverse movement guides the chips 44 either into the track 63 or into the track 64.

Again, the slope on the leading edge of the rhomboidal shape determines which one of the two branch tracks 63 or 64 the chips 44 will enter. This embodiment is, however, not preferred for use with vibratory motion of the track, since the chips 44 have a tendency to rotate as the leading edge of the chips contact the center obstruction 68. However, the embodiment of FIG. 5 may become advantageous when articles such as the chips 44 are intended to be advanced by air jets projected through apertures in the track. Apertures may then direct air outwardly from a longitudinal centerline. Once the article has moved partially to one side or the other of the centerline of the track 60, air jets can then be used to direct the article in translational movement into one track or the other.

The above description is for illustrative purposes only and is not intended to limit the scope of this invention. Also various changes and alterations are possible within the spirit and scope of this invention.

What is claimed is:

1. An apparatus for sorting electronic articles in the shape of parallelepipeds having rhomboidal bases as major surfaces into two groups, each group being distinct from the other by the orientation of the bases of the articles, which comprises:
    a feed track for advancing the articles in a single row, along a path with one or another of the major surfaces of the articles supported by a base surface of the track;
    guides, spaced laterally in parallel along the track to support the advancing movement of each such article substantially without rotation of such article away from its direction of travel along the feed track;
    first and second branch tracks coupled to the feed track and forming a fork at one end thereof;
    a single obstruction fixedly mounted in the center of the path of the articles at the fork for engaging the leading edge of the articles and deflecting the articles into a selected one of the branch tracks depending on the direction in which the leading edge of the articles forms an acute angle with the direction in which the articles are advanced along the track; and
    one recess on each side of the track located in the guides adjacent to the fork to receive a trailing corner of articles and permit rotation of the articles toward either branch track after contact of the leading edge of the article with the obstruction.

* * * * *